(12) United States Patent
Jacob et al.

(10) Patent No.: US 11,056,535 B2
(45) Date of Patent: Jul. 6, 2021

(54) NON-VOLATILE MEMORY ELEMENT ARRAYS IN A WHEATSTONE BRIDGE ARRANGEMENT

(71) Applicant: GLOBALFOUNDRIES U.S. Inc., Santa Clara, CA (US)

(72) Inventors: Ajey Poovannummoottil Jacob, Watervliet, NY (US); Amogh Agrawal, West Lafayette, IN (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 148 days.

(21) Appl. No.: 16/425,360

(22) Filed: May 29, 2019

(65) Prior Publication Data

US 2020/0381476 A1 Dec. 3, 2020

(51) Int. Cl.
| | |
|---|---|
| *G11C 11/16* | (2006.01) |
| *H01L 27/22* | (2006.01) |
| *H01L 43/10* | (2006.01) |
| *H01F 10/32* | (2006.01) |
| *H01L 45/00* | (2006.01) |
| *H01L 43/02* | (2006.01) |
| *G11C 13/00* | (2006.01) |
| *H01L 27/24* | (2006.01) |

(Continued)

(52) U.S. Cl.
CPC .......... *H01L 27/228* (2013.01); *G11C 11/161* (2013.01); *G11C 11/1675* (2013.01); *G11C 13/0004* (2013.01); *G11C 13/0069* (2013.01); *H01F 10/329* (2013.01); *H01F 10/3254* (2013.01); *H01F 41/32* (2013.01); *H01L 23/528* (2013.01); *H01L 27/2436* (2013.01); *H01L 43/02* (2013.01); *H01L 43/10* (2013.01); *H01L 45/06* (2013.01); *H01L 45/08* (2013.01); *H01L 45/12* (2013.01); *H01L 45/144* (2013.01)

(58) Field of Classification Search
CPC ............ G11C 11/40615; G11C 7/1057; G11C 11/4093; G11C 29/021; G11C 29/022; G11C 29/028; G11C 7/10; G11C 29/023; G11C 2207/2254; G06F 3/0659
See application file for complete search history.

(56) References Cited

U.S. PATENT DOCUMENTS

| | | | | |
|---|---|---|---|---|
| 2008/0272771 | A1* | 11/2008 | Guo ..................... | G01R 33/098 324/260 |
| 2012/0049843 | A1* | 3/2012 | Sun ......................... | H01L 43/12 324/249 |

(Continued)

OTHER PUBLICATIONS

Ryu et al., "A Self-Reference Sensing for Improving Reliability and Bandwidth with 2T2MTJ STT-MRAM Cell", 2016 16th Non-Volatile Memory Technology Symposium (NVMTS), Pittsburgh, PA, 2016, pp. 1-4.

(Continued)

*Primary Examiner* — Mohammed A Bashar
(74) *Attorney, Agent, or Firm* — Thompson Hine LLP (57) ABSTRACT

Structures for a bitcell of a non-volatile memory and methods of fabricating and using such structures. Non-volatile memory elements are arranged in a Wheatstone bridge arrangement having a first terminal and a second terminal. A first field-effect transistor is coupled with the first terminal of the Wheatstone bridge arrangement, and a second field-effect transistor is coupled with the second terminal of the Wheatstone bridge arrangement.

20 Claims, 4 Drawing Sheets

(51) Int. Cl.
*H01L 23/528* (2006.01)
*H01F 41/32* (2006.01)

(56) References Cited

U.S. PATENT DOCUMENTS

2015/0204696 A1* 7/2015 Hirota ................. G01D 5/16
 324/207.21
2019/0195713 A1* 6/2019 Mochizuki ............... B62D 6/10

OTHER PUBLICATIONS

Noguchi et al., "A 250-MHz 256b-I/O 1-Mb STT-MRAM with Advanced Perpendicular MTJ based Dual Cell for Nonvolatile Magnetic Caches to Reduce Active Power of Processors", 2013 Symposium on VLSI Circuits, Kyoto, 2013, pp. C108-C109.

* cited by examiner

NON-VOLATILE MEMORY ELEMENT ARRAYS IN A WHEATSTONE BRIDGE ARRANGEMENT

BACKGROUND

The present invention relates to integrated circuits and semiconductor device fabrication and, more specifically, to structures for a bitcell of a non-volatile memory and methods of fabricating and using such structures.

A magnetic random access memory (MRAM) device provides an embedded non-volatile memory technology in which the memory elements operate based on principles of magnetoresistance. Because its memory elements are non-volatile, the data stored by the magnetic random access memory device is retained when the memory elements are not powered.

In a magnetic random access memory bitcell, data is stored by a magnetoresistive memory element that includes a pinned layer and a free layer, each of which holds a magnetization. The magnetization of the pinned layer is fixed in its magnetic orientation, and the magnetization of the free layer can be switched by the application of a programming current. In particular, the magnetic orientations of the magnetic layers may have either a parallel state that provides a low resistance across the layers ("0" state) or an antiparallel state that provides a high resistance across the layers ("1" state). The switching of the magnetic orientation of the free layer and the resulting high-resistance or low-resistance states provide for the write and read operations of the magnetic random access memory bitcell.

Multiple magnetic random access memory bitcells may be arranged in an array of rows and columns to define a magnetic random access memory device. Each magnetic random access memory bitcell in the array includes a magnetoresistive memory element and a field-effect transistor that controls access to the magnetoresistive memory element for reading and writing data. A word line is connected to the gates of the field-effect transistors in each column of the array. The word line may be used to select the field-effect transistors in a column of magnetic random access memory bitcells for data read and write operations to the related magnetoresistive memory element.

In read operations, the different states of the magnetic random access memory bitcell may be characterized by a parameter known as the tunnel magnetoresistance ratio (TMR), which signifies the sensing margin, or the difference between the low-resistance and high-resistance states. Magnetic random access memory bitcells may have a low tunnel magnetoresistance ratio, which can lead to a marginal sensing margin. In addition, process variations may further impact the sensing margin for the different states and lead to inaccurate read operations. The value of the tunnel magnetoresistance ratio is rarely sufficient to counteract the effects of process variations.

Improved structures for a bitcell of a non-volatile memory and methods of fabricating and using such structures are needed.

SUMMARY

According to an embodiment of the invention, a structure includes a plurality of non-volatile memory elements that are arranged in a Wheatstone bridge arrangement having a first terminal and a second terminal. A first field-effect transistor is coupled with the first terminal, and a second field-effect transistor is coupled with the second terminal.

According to another embodiment of the invention, a method includes forming a first field-effect transistor and a second field-effect transistor, and forming a plurality of non-volatile memory elements in a interconnect structure that is positioned over the first field-effect transistor and the second field-effect transistor. The plurality of non-volatile memory elements are arranged in the interconnect structure with a Wheatstone bridge arrangement. The first field-effect transistor is coupled through the interconnect structure with a first terminal of the Wheatstone bridge arrangement. The second field-effect transistor is coupled through the interconnect structure with a second terminal of the Wheatstone bridge arrangement.

According to another embodiment of the invention, a method includes placing a plurality of non-volatile memory elements having a Wheatstone bridge arrangement in a first combination of parallel states and anti-parallel states to write a first memory state of a bitcell, and placing the non-volatile memory elements having the Wheatstone bridge arrangement in a second combination of parallel states and anti-parallel states to write a second memory state of the bitcell.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
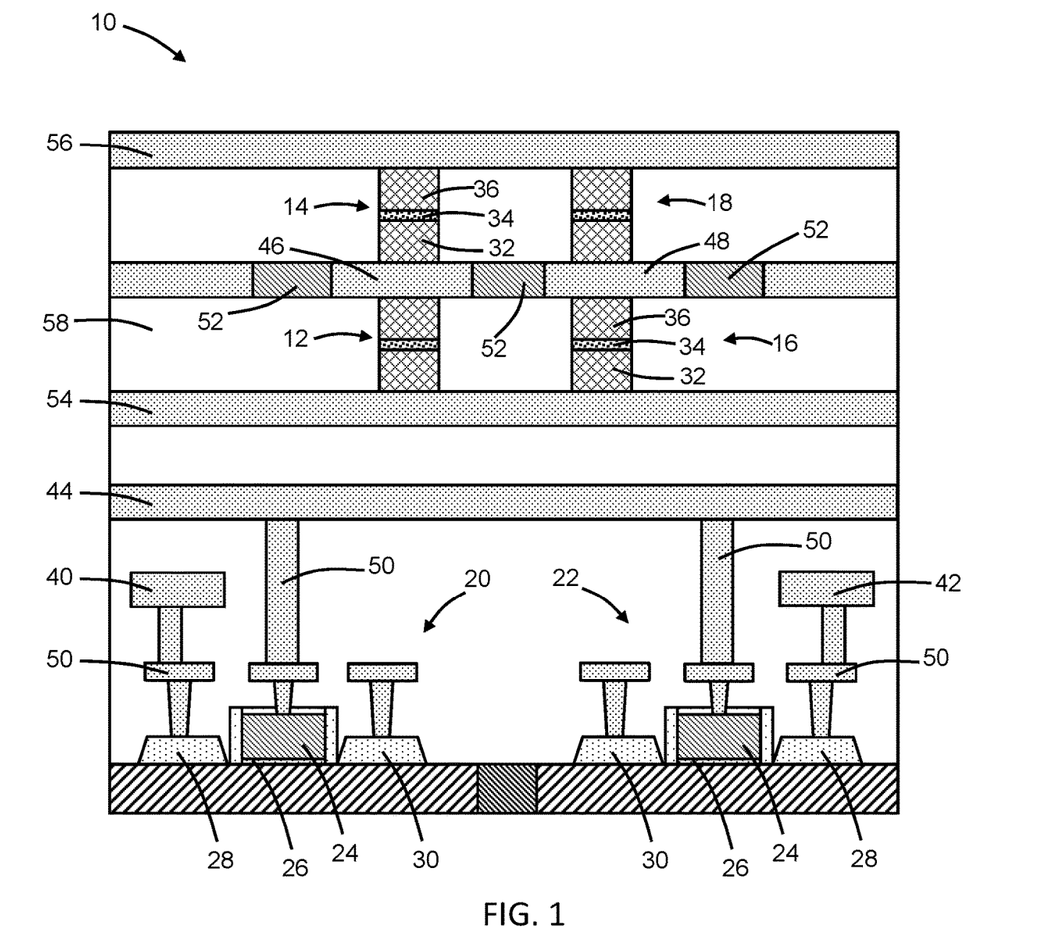
FIGS. 1-3 are diagrammatic cross-sectional views of a bitcell in accordance with embodiments of the invention.
Figure 2:
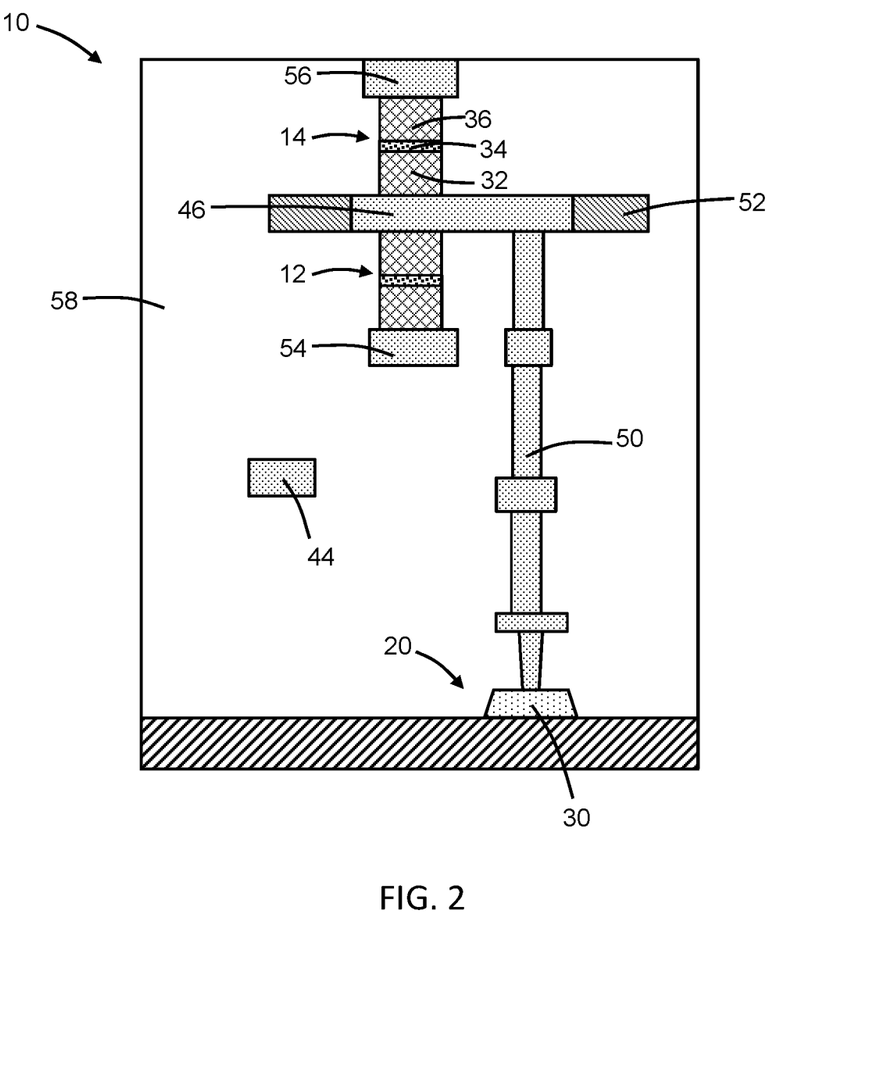
Figure 3:
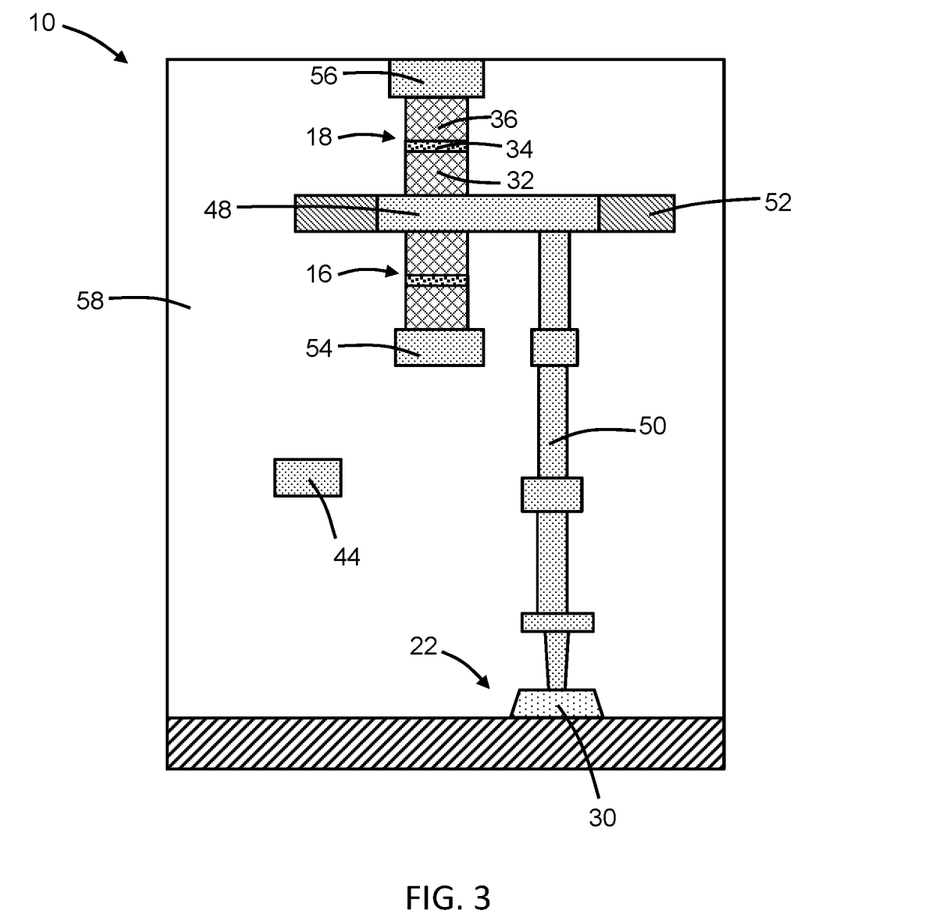
Figure 4:
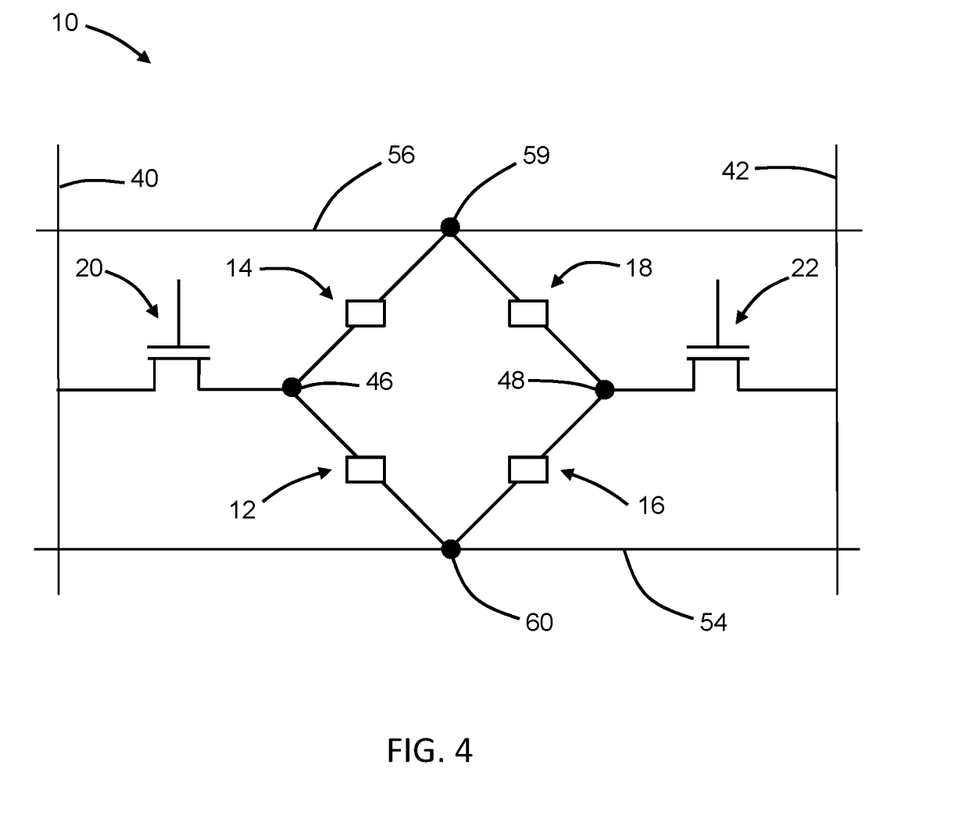
FIG. 4 is a circuit diagram of the bitcell of FIG. 1.

With reference to FIGS. 1, 2 and in accordance with embodiments of the invention, a bitcell 10 for a magnetic random access memory (MRAIVI) includes multiple non-volatile memory elements 12, 14, 16, 18 and field-effect transistors 20, 22 that are coupled with the non-volatile memory elements 12, 14, 16, 18. In an embodiment, the non-volatile memory elements 12, 14, 16, 18 may be magnetic tunneling junction (MTJ) memory elements. The field-effect transistors 20, 22, which provide access transistors of the bitcell 10, may be formed by front-end-of-line (FEOL) processing using a substrate that may be composed of a single-crystal semiconductor material, such as single-crystal silicon. In an embodiment, each of the field-effect transistors 20, 22 may include a gate structure having a gate electrode 24 and a gate dielectric 26. The gate electrode 24 may be composed of a conductor, such as doped polycrystalline silicon (i.e., doped polysilicon), and the gate dielectric 26 may be composed of an electrical insulator, such as silicon dioxide. Alternatively, the gate electrode 24 may include one or more conformal barrier metal layers and/or work function metal layers, such as metal layers composed of titanium aluminum carbide and/or titanium nitride, and a metal gate fill layer composed of a conductor, such as tungsten, and the gate dielectric 26 may be composed of a high-k dielectric material, such as hafnium oxide. The field-effect transistors 20, 22 may be n-type field-effect transistors (NFETs) that each include a source region 28 and a drain region 30 composed of a semiconductor material (e.g., silicon) that may be grown by an epitaxial growth process and that may be doped to contain an n-type dopant (e.g., arsenic and/or phosphorus) providing n-type conductivity.

In the representative embodiment, the field-effect transistors 20, 22 are planar field-effect transistors. In an alternative embodiment, the field-effect transistors 20, 22 may be fin-type field-effect transistors each formed using one or more semiconductor fins, and the respective gate structure may overlap with and wrap about the sides of the one or more semiconductor fins with the gate dielectric 26 arranged between the gate electrode 24 and the sides of the fins. In an alternative embodiment, the field-effect transistors 20, 22 may be gate-all-around field-effect transistors in which semiconductor channel layers are arranged in a layer stack and the gate electrode 24 is wrapped about all sides of each semiconductor channel layer.

An interconnect structure may be formed by middle-of-line (MOL) processing and/or back-end-of-line (BEOL) processing over the field-effect transistors 20, 22 after FEOL processing is completed. The non-volatile memory elements 12, 14, 16, 18 are formed in one or more of the metallization levels, and conductive features formed in one or more intervening metallization levels of the interconnect structure provide interconnect paths connecting the field-effect transistors 20, 22 with the non-volatile memory elements 12, 14, 16, 18.

Each of the non-volatile memory elements 12, 14, 16, 18 includes a pinned or fixed layer 32, a tunnel barrier layer 34, and a free layer 36. The fixed layer 32 may be a layer stack that includes one or more magnetic layers composed of, for example, a cobalt-iron-boron alloy or a cobalt-iron alloy deposited by physical vapor deposition. The magnetization of the fixed layer 32 is pinned such that the magnetization cannot flip (i.e., rotate). The tunnel barrier layer 34 may be composed of a non-magnetic and electrically insulating layer, such as magnesium oxide or aluminum oxide. The free layer 36 may also be composed of an alloy magnetic layer or a multilayer that includes one or more layers of, for example, a cobalt-iron-boron alloy or a cobalt-iron alloy, or a nickel-iron alloy. The magnetization of the free layer 36 is not pinned such that the magnetization can flip (i.e., rotate). The non-volatile memory elements 12, 14, 16, 18 may also include top and/or bottom electrodes (not shown) each comprised of a conductive material, such as tantalum and/or ruthenium.

The magnetization or magnetic orientation of the fixed layer 32 is pinned to a particular direction while the magnetization or magnetic orientation of the free layer 36 may be switched by a programming current supplied by applied bias voltages. In particular, the magnetization of the free layer 36 may be switched by the programming current to be aligned in a direction parallel to the magnetization of the fixed layer 32, or switched by the programming current to be aligned in a direction antiparallel to the magnetization the fixed layer 32, depending on a direction of the programming current supplied to each of the non-volatile memory elements 12, 14, 16, 18. Because of increased tunneling across the tunnel barrier layer 34 in the parallel state, the electrical resistance across the tunnel barrier layer 34 between the free layer 36 and the fixed layer 32 in the parallel state is less than the electrical resistance across the tunnel barrier layer 34 between the free layer 36 and the fixed layer 32 in the antiparallel state.

The non-volatile memory elements 12, 14, 16, 18 may rely on principles of spin transfer torque to effectuate a change in the direction of magnetization of the free layer 36 that provides the parallel and antiparallel states. To that end, the non-volatile memory elements 12, 14, 16, 18 may cause a spin-polarized programming current to flow vertically through each of the non-volatile memory elements 12, 14, 16, 18. When electrons of the programming current flow from the fixed layer 32 to the free layer 36, spin torque from these electrons orientates the magnetization of the free layer 36 in a direction that is parallel to the magnetization of the fixed layer 32. When electrons of the programming current flow in a direction from the free layer 36 to the fixed layer 32, spin torque from electrons that are reflected from the fixed layer 32 back into the free layer 36 orientates the magnetization of the free layer 36 to be anti-parallel relative to the magnetization of the fixed layer 32. Thus, controlling the direction of the electron flow (i.e., programming current) causes switching of the direction of magnetization of the free layer 36 relative to the fixed layer 32, and the associated resistance changes between low and high states based on the magnetization of the free layer 36, i.e. parallel versus anti-parallel, relative to that of the fixed layer 32.

In an alternative embodiment, the non-volatile memory elements 12, 14, 16, 18 of the bitcell 10 may be resistive memory elements that are included in a resistive random access memory (ReRAM) array. Data is stored in each of the resistive memory elements by changing the resistance across a layer containing a dielectric material to provide different states. The dielectric material, which is normally insulating, can be made to conduct through one or more filaments or conductive paths generated by applying a sufficiently high voltage. The memory element of the bitcell 10 switches between the insulating and conducting phases by creating or destroying the filament(s) to provide a "0" state or a "1" state.

In an alternative embodiment, the non-volatile memory elements 12, 14, 16, 18 of the bitcell 10 may be phase change material (PCM) memory elements that are included in a PCM memory array. Data is stored in each of the resistive memory elements by, for example, heating a chalcogenide glass, such as $Ge_2Sb_2Te_5$, to produce either an amorphous phase or a crystalline phase to provide a "0" state or a "1" state.

The interconnect structure includes a bit line 40 coupled with the source region 28 of the field-effect transistor 20, a complementary bit line 42 coupled with the source region 28 of the field-effect transistor 22, a word line 44 coupled with the gate electrodes 24 of the field-effect transistors 20, 22, a terminal 46 between the non-volatile memory elements 12 and 14 that is coupled with the drain region 30 of the field-effect transistor 20, and a terminal 48 between the non-volatile memory elements 16 and 18 that is coupled with the drain region 30 of the field-effect transistor 22. The terminals 46, 48 are defined by metal islands and dielectric regions 52 that may be formed by etching trenches in a metal line with lithography and etching processes to form the metal islands, and then filling the trenches with a dielectric material, such as silicon dioxide. The non-volatile memory elements 12, 14 are arranged in a leg of a Wheatstone bridge array or arrangement that includes the non-volatile memory elements 12, 14, 16, 18, and the non-volatile memory elements 16, 18 are arranged in another leg of the Wheatstone bridge array or arrangement.

The interconnect structure further includes a complementary drive line 54 positioned in a vertical direction within a metallization level under the non-volatile memory elements 12, 14, 16, 18 and a drive line 56 positioned in the vertical direction within a different metallization level over the non-volatile memory elements 12, 14, 16, 18. The terminals 46, 48 are arranged in a metallization level that is positioned in the vertical direction between the metallization level including the drive line 56 and the metallization level including the complementary drive line 54. The non-volatile memory elements 12, 14 are positioned in the vertical direction between the complementary drive line 54 and the terminals 46, 48. The non-volatile memory elements 16, 18 are arranged in the vertical direction between the drive line 56 and the terminals 46, 48.

The metallization levels include dielectric layers 58 that may be composed of a dielectric material, such as carbon-doped silicon dioxide deposited by chemical vapor deposition. Vertical interconnects 50 may be provided by contacts, vias, and metal islands in the different metallization levels, and may be used to couple the various components. The contacts may be composed of a conductor, such as a metal like tungsten or cobalt. The bit line 40, complementary bit line 42, word line 44, terminals 46, 48, complementary drive line 54, and drive line 56, as well as the vias and metal islands, may be composed of a conductor, such as copper or cobalt, formed by a back-end-of-line processes.

The non-volatile memory elements 12, 14, 16, 18 and the field-effect transistors 20, 22 provide a two transistor-four memory element (2T-4R) bitcell design. The non-volatile memory elements 12, 14, 16, 18 and field-effect transistors 20, 22 of the bitcell 10 may be arranged in rows and columns with other similar bitcells 10 to define a non-volatile memory device. The complementary drive line 54 and drive line 56 are directly routed within the metallization levels of the interconnect structure, and do not require any connections in the interconnect structure with the field-effect transistors 20, 22. The non-volatile memory elements 12, 16 are stacked below the non-volatile memory elements 14, 18 between the complementary drive line 54 and drive line 56 with the non-volatile memory elements 12, 14 in one stack and the non-volatile memory elements 16, 18 in another stack. The connection of the non-volatile memory elements 14, 18 with the complementary drive line 54 provides a terminal 59 of the Wheatstone bridge arrangement, and the connection of the non-volatile memory elements 12, 16 with the drive line 56 provides another terminal 60 of the Wheatstone bridge arrangement.

In use, the bitcell 10 may hold data in a pair of different states, namely a high logic state and a low logic state. In the high logic state, the fixed layer 32 and free layer 36 of the non-volatile memory elements 12 and 18 are both aligned in the anti-parallel state characterized by high electrical resistance, and the fixed layer 32 and free layer 36 of the non-volatile memory elements 14 and 16 are both aligned in the parallel state characterized by low electrical resistance. In the low logic state, the fixed layer 32 and free layer 36 of the non-volatile memory elements 14 and 16 are both aligned in the anti-parallel state characterized by high electrical resistance, and the fixed layer 32 and free layer 36 of the non-volatile memory elements 12 and 18 are both aligned in the parallel state characterized by low electrical resistance.

To perform a read operation, the complementary drive line 54 may be grounded and drive line 56 may be set to a particular read voltage. Both legs of the Wheatstone bridge form a voltage divider, which causes a voltage to develop between the bit line 40 and complementary bit line 42. The voltage at the bit line 40 is equal to the read voltage times the antiparallel resistance value divided by the sum of the resistance values in the parallel and antiparallel states. The voltage at the complementary bit line 42 is equal to the read voltage times the parallel resistance value divided by the sum of the resistance values in the parallel and antiparallel states. The voltage differential is equal to the difference between the voltage at the bit line 40 and the voltage at the complementary bit line 42. The sensing margin of the bitcell 10 may be increased due at least in part to the use of more than two (e.g., four) non-volatile memory elements 12, 14, 16, 18 having a Wheatstone bridge arrangement.

To perform a write operation providing a high logic state, a two-step operation is performed using voltages supplied to the complementary drive line 54 and drive line 56. The bit line 40 is grounded and the voltage at the complementary bit line 42 is set equal to a positive bias voltage supplied from a positive power supply ($V_{DD}$) rail. In an initial step, the voltage supplied to the drive line 56 is set equal to the positive bias voltage and the complementary drive line 54 is grounded. The direction of the currents aligns the fixed layer 32 and free layer 36 of the non-volatile memory element 14 in the parallel state and also aligns the fixed layer 32 and free layer 36 of the non-volatile memory element 16 in the parallel state. In a subsequent step, the voltage supplied to the complementary drive line 54 is set equal to the positive bias voltage and the drive line 56 is grounded. The direction of the currents aligns the fixed layer 32 and free layer 36 of the non-volatile memory element 12 in the anti-parallel state and also aligns the fixed layer 32 and free layer 36 of the non-volatile memory element 18 in the anti-parallel state.

To perform a write operation providing a low logic state, a two-step operation is also performed using voltages supplied to the complementary drive line 54 and drive line 56. The complementary bit line 42 is grounded and the voltage at the bit line 40 is set equal to a positive bias voltage supplied from a positive power supply ($V_{DD}$) rail. In an initial step, the voltage supplied to the drive line 56 is set equal to the positive bias voltage and the complementary drive line 54 is grounded. The direction of the currents aligns the fixed layer 32 and free layer 36 of the non-volatile memory element 12 in the parallel state and also aligns the fixed layer 32 and free layer 36 of the non-volatile memory element 18 in the parallel state. In a subsequent step, the voltage supplied to the complementary drive line 54 is set equal to the positive bias voltage and the drive line 56 is grounded. The direction of the currents aligns the fixed layer 32 and free layer 36 of the non-volatile memory element 14 in the anti-parallel state and also aligns the fixed layer 32 and free layer 36 of the non-volatile memory element 16 in the anti-parallel state.

Each of the currents used to write the low and high logic states originate, in part, from one or the other of the field-effect transistors 20, 22 and, in part, from one or the other the complementary drive line 54 and the drive line 56. This scheme for supplying currents may lower the occurrence of write failures and may permit the size of the field-effect transistors 20, 22 to be reduced, thereby reducing the footprint of the bitcell 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smart-phones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/− 10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a bitcell, the structure comprising:
   a plurality of non-volatile memory elements arranged in a Wheatstone bridge arrangement having a first terminal and a second terminal;
   a first field-effect transistor coupled with the first terminal;
   a second field-effect transistor coupled with the second terminal; and
   an interconnect structure that is positioned over the first field-effect transistor and the second field-effect transistor, the interconnect structure including a bit line coupled by the first field-effect transistor with the first terminal and a complementary bit line coupled by the second field-effect transistor with the second terminal, wherein the non-volatile memory elements are positioned in the interconnect structure.

2. The structure of claim 1 wherein the non-volatile memory elements in the Wheatstone bridge arrangement have a third terminal and a fourth terminal, and further comprising:
   a drive line coupled with the third terminal; and
   a complementary drive line coupled with the fourth terminal.

3. The structure of claim 2 wherein at least one of the non-volatile memory elements is coupled between the drive line and the first field-effect transistor, and at least one of the non-volatile memory elements is coupled between the drive line and the second field-effect transistor.

4. The structure of claim 2 wherein at least one of the non-volatile memory elements is arranged in the Wheatstone bridge arrangement between the complementary drive line and the first field-effect transistor, and at least one of the non-volatile memory elements is arranged in the Wheatstone bridge arrangement between the complementary drive line and the second field-effect transistor.

5. The structure of claim 2 wherein the drive line is positioned in a first metallization level of the interconnect structure, and the complementary drive line is positioned in a second metallization level of the interconnect structure.

6. The structure of claim 5 wherein the non-volatile memory elements are positioned in the interconnect structure in a vertical direction between the drive line and the complementary drive line, and the non-volatile memory elements are arranged in stacked pairs in the vertical direction.

7. The structure of claim 5 wherein the non-volatile memory elements include a first non-volatile memory element coupled between the drive line and the first terminal, a second non-volatile memory element coupled between the drive line and the second terminal, a third non-volatile memory element coupled between the complementary drive line and the first terminal, and a fourth non-volatile memory element coupled between the complementary drive line and the second terminal.

8. The structure of claim 5 wherein the first terminal and the second terminal comprise respective metal islands arranged in a third metallization level of the interconnect structure, the third metallization level is positioned between the first metallization level and the second metallization level in a vertical direction, and a dielectric region is arranged between the metal islands in the third metallization level.

9. The structure of claim 5 wherein the bit line and the complementary bit line are positioned in a third metallization level of the interconnect structure, and the third metallization level is positioned below the first metallization level and the second metallization level.

10. The structure of claim 1 wherein the non-volatile memory elements are magnetoresistive random access memory (MRAM) elements.

11. The structure of claim 1 wherein the non-volatile memory elements are resistive random access memory (ReRAM) elements .

12. A method of forming a structure for a bitcell, the method comprising:
    forming a first field-effect transistor and a second field-effect transistor;
    forming a plurality of non-volatile memory elements in an interconnect structure that is positioned over the first field-effect transistor and the second field-effect transistor, wherein the non-volatile memory elements are arranged in a Wheatstone bridge arrangement;
    forming a bit line in the interconnect structure that is coupled by the first field-effect transistor with a first terminal of the Wheatstone bridge arrangement; and
    forming a complementary bit line in the interconnect structure that is coupled by the second field-effect transistor with a second terminal of the Wheatstone bridge arrangement.

13. The method of claim 12 wherein the non-volatile memory elements are magnetoresistive random access memory (MRAM) elements.

14. The method of claim 12 wherein the non-volatile memory elements in the Wheatstone bridge arrangement have a third terminal and a fourth terminal, and further comprising:
forming a drive line in the interconnect structure that is coupled with the third terminal; and
forming a complementary drive line in the interconnect structure that is coupled with the fourth terminal.

15. The method of claim 14 wherein the drive line is positioned in a first metallization level of the interconnect structure, the complementary drive line is positioned in a second metallization level of the interconnect structure, and the non-volatile memory elements are stacked in the interconnect structure in a vertical direction between the drive line and the complementary drive line.

16. The method of claim 15 further comprising:
forming a metal line in a third metallization level of the interconnect structure;
patterning the metal line to define a trench; and
filling the trench with a dielectric material to form a dielectric region that is arranged between respective metal islands defining the first terminal and the second terminal,
wherein the third metallization level is positioned within the interconnect structure in the vertical direction between the first metallization level and the second metallization level.

17. A method comprising:
placing a plurality of non-volatile memory elements having a Wheatstone bridge arrangement in a first combination of parallel states and anti-parallel states to write a first memory state of a bitcell; and
placing the non-volatile memory elements having the Wheatstone bridge arrangement in a second combination of parallel states and anti-parallel states to write a second memory state of the bitcell,
wherein the first combination of parallel states and anti-parallel states and the second combination of parallel states and anti-parallel states are each provided by a two-step write operation in which a first biasing step with a first current provides the parallel states and a second biasing step with a second current provides the anti-parallel states, and the first current and the second current each include a first portion provided from a drive line and a second portion provided by a transistor.

18. The structure of claim 1 wherein the non-volatile memory elements are phase change material (PCM) elements.

19. The method of claim 12 wherein the non-volatile memory elements are resistive random access memory (ReRAM) elements.

20. The method of claim 12 wherein the non-volatile memory elements are phase change material (PCM) elements.

* * * * *